(12) United States Patent
Otremba et al.

(10) Patent No.: US 9,147,628 B2
(45) Date of Patent: Sep. 29, 2015

(54) PACKAGE-IN-PACKAGES AND METHODS OF FORMATION THEREOF

(75) Inventors: Ralf Otremba, Kaufbeuren (DE); Josef Hoeglauer, Kirchhein-Heimstetten (DE); Juergen Schredl, Mering (DE); Xaver Schloegel, Sachsenkam (DE); Klaus Schiess, Allensbach (DE)

(73) Assignee: Infineon Technoloiges Austria AG, Villach (AT)

( * ) Notice: Subject to any disclaimer, the term of this patent is extended or adjusted under 35 U.S.C. 154(b) by 143 days.

(21) Appl. No.: 13/535,052

(22) Filed: Jun. 27, 2012

(65) Prior Publication Data
US 2014/0001615 A1  Jan. 2, 2014

(51) Int. Cl.
*H01L 23/495* (2006.01)
*H01L 21/60* (2006.01)
(Continued)

(52) U.S. Cl.
CPC .......... *H01L 23/3135* (2013.01); *H01L 21/561* (2013.01); *H01L 21/568* (2013.01); *H01L 23/3107* (2013.01); *H01L 23/49537* (2013.01); *H01L 23/49541* (2013.01); *H01L 23/49548* (2013.01); *H01L 23/49575* (2013.01); *H01L 23/5389* (2013.01); *H01L 24/19* (2013.01); *H01L 24/20* (2013.01); *H01L 24/24* (2013.01); *H01L 24/25* (2013.01); *H01L 24/48* (2013.01); *H01L 24/82* (2013.01); *H01L 24/83* (2013.01); *H01L 24/85* (2013.01); *H01L 24/05* (2013.01); *H01L 24/27* (2013.01); *H01L 24/29* (2013.01); *H01L 24/32* (2013.01); *H01L 24/40* (2013.01); *H01L 24/45* (2013.01); *H01L 2224/04026* (2013.01); *H01L 2224/04034* (2013.01); *H01L 2224/04042* (2013.01); *H01L 2224/04105* (2013.01); *H01L 2224/05184* (2013.01); *H01L 2224/05187* (2013.01); *H01L 2224/05611* (2013.01); *H01L 2224/05618* (2013.01);
(Continued)

(58) Field of Classification Search
CPC ............ H01L 23/49575; H01L 21/561; H01L 21/568; H01L 23/3107; H01L 23/3135
USPC ........................... 257/723, 724, 725; 438/107
See application file for complete search history.

(56) References Cited

U.S. PATENT DOCUMENTS 4,818,821 A * 4/1989 Wentworth et al. ........... 174/546
5,173,766 A * 12/1992 Long et al. ..................... 257/687
(Continued)

OTHER PUBLICATIONS

Wojnowski, et al., "Package Trends for Today's and Future mm-Wave Applications," 38th European Microwave Conference 2008, Amsterdam, Oct. 28-31, 2008, Infineon, pp. 1-55.
(Continued)

*Primary Examiner* — Michael Lebentritt
*Assistant Examiner* — Jordan Klein
(74) *Attorney, Agent, or Firm* — Slater & Matsil, L.L.P.

(57) ABSTRACT

In accordance with an embodiment of the present invention, a semiconductor device includes a leadframe having a plurality of leads and a die paddle and a semiconductor module attached to the die paddle of the leadframe. The semiconductor module includes a first semiconductor chip disposed in a first encapsulant. The semiconductor module has a plurality of contact pads coupled to the first semiconductor chip. The semiconductor device further includes a plurality of interconnects coupling the plurality of contact pads with the plurality of leads, and a second encapsulant disposed at the semiconductor module and the leadframe.

17 Claims, 15 Drawing Sheets

(51) Int. Cl.
*H01L 23/31* (2006.01)
*H01L 23/538* (2006.01)
*H01L 21/56* (2006.01)
*H01L 23/00* (2006.01)

(52) U.S. Cl.
CPC ............... *H01L2224/05624* (2013.01); *H01L 2224/05638* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05684* (2013.01); *H01L 2224/211* (2013.01); *H01L 2224/245* (2013.01); *H01L 2224/24011* (2013.01); *H01L 2224/24137* (2013.01); *H01L 2224/2518* (2013.01); *H01L 2224/27318* (2013.01); *H01L 2224/291* (2013.01); *H01L 2224/2919* (2013.01); *H01L 2224/29116* (2013.01); *H01L 2224/29294* (2013.01); *H01L 2224/29339* (2013.01); *H01L 2224/32225* (2013.01); *H01L 2224/40095* (2013.01); *H01L 2224/40105* (2013.01); *H01L 2224/40227* (2013.01); *H01L 2224/40247* (2013.01); *H01L 2224/45124* (2013.01); *H01L 2224/45144* (2013.01); *H01L 2224/45147* (2013.01); *H01L 2224/45499* (2013.01); *H01L 2224/48091* (2013.01); *H01L 2224/48105* (2013.01); *H01L 2224/48227* (2013.01); *H01L 2224/48247* (2013.01); *H01L 2224/48464* (2013.01); *H01L 2224/48472* (2013.01); *H01L 2224/48476* (2013.01); *H01L 2224/48499* (2013.01); *H01L 2224/48624* (2013.01); *H01L 2224/73263* (2013.01); *H01L 2224/73265* (2013.01); *H01L 2224/73267* (2013.01); *H01L 2224/82101* (2013.01); *H01L 2224/82104* (2013.01); *H01L 2224/82106* (2013.01); *H01L 2224/8385* (2013.01); *H01L 2224/83815* (2013.01); *H01L 2224/83851* (2013.01); *H01L 2224/83862* (2013.01); *H01L 2224/85203* (2013.01); *H01L 2224/85205* (2013.01); *H01L 2224/85207* (2013.01); *H01L 2224/85815* (2013.01); *H01L 2224/92136* (2013.01); *H01L 2224/92137* (2013.01); *H01L 2224/92247* (2013.01); *H01L 2924/014* (2013.01); *H01L 2924/12032* (2013.01); *H01L 2924/1301* (2013.01); *H01L 2924/1305* (2013.01); *H01L 2924/1306* (2013.01); *H01L 2924/13055* (2013.01); *H01L 2924/13062* (2013.01); *H01L 2924/19107* (2013.01)

(56) References Cited

U.S. PATENT DOCUMENTS

| | | | | |
|---|---|---|---|---|
| 6,558,977 | B2 * | 5/2003 | Nakaoka et al. | 438/107 |
| 6,583,512 | B2 * | 6/2003 | Nakaoka et al. | 257/777 |
| 6,906,416 | B2 * | 6/2005 | Karnezos | 257/723 |
| 7,005,730 | B2 * | 2/2006 | Verma et al. | 257/676 |
| 7,247,934 | B2 * | 7/2007 | Pu | 257/686 |
| 7,382,045 | B2 * | 6/2008 | Osako et al. | 257/679 |
| 7,473,582 | B2 | 1/2009 | Wood et al. | |
| 7,615,855 | B2 * | 11/2009 | Osako et al. | 257/679 |
| 7,969,018 | B2 * | 6/2011 | Otremba et al. | 257/777 |
| 2003/0032216 | A1 * | 2/2003 | Nakaoka et al. | 438/106 |
| 2004/0029314 | A1 * | 2/2004 | Nakaoka et al. | 438/106 |
| 2006/0131746 | A1 * | 6/2006 | Kohara et al. | 257/737 |
| 2007/0058471 | A1 * | 3/2007 | Rajan et al. | 365/222 |
| 2008/0067667 | A1 * | 3/2008 | Mahler et al. | 257/702 |
| 2008/0128900 | A1 * | 6/2008 | Leow et al. | 257/723 |
| 2012/0193799 | A1 * | 8/2012 | Sakuma et al. | 257/770 |
| 2013/0234283 | A1 * | 9/2013 | Standing et al. | 257/528 |
| 2013/0241077 | A1 * | 9/2013 | Fuergut et al. | 257/774 |

OTHER PUBLICATIONS

"PGA Package," PGA (pin grid array), Webpage, ITWissen.info, retrieved Jun. 26, 2012, 1 page, <http://www.itwissen.info/definition/lexikon/pin-grid-array-PGA-PGA-Package.html>.

* cited by examiner

PACKAGE-IN-PACKAGES AND METHODS OF FORMATION THEREOF

TECHNICAL FIELD

The present invention relates generally to semiconductor devices, and more particularly to package-in-packages and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Typical packaging features, such as dimensions of the package, pin count, etc., may comply, among others, with open standards from Joint Electron Devices Engineering Council (JEDEC). Packaging may also be referred as semiconductor device assembly or simply assembly.

Consequently, although the size of the semiconductor chips scales continuously due to semiconductor technology scaling, the size of the packages does not because of the need to comply with standard packaging dimensions. Further, increasingly for many applications, a single package may include multiple semiconductor dies or chips. However, conventional packages cannot support multiple semiconductor chips or tiny semiconductor chips.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a leadframe having a plurality of leads and a die paddle and a semiconductor module attached to the die paddle of the leadframe. The semiconductor module comprises a first semiconductor chip disposed in a first encapsulant. The semiconductor module has a plurality of contact pads coupled to the first semiconductor chip. The semiconductor device further comprises a plurality of interconnects coupling the plurality of contact pads with the plurality of leads, and a second encapsulant disposed at the semiconductor module and the leadframe.

In accordance with an embodiment of the present invention, a semiconductor device comprises a leadframe having a plurality of leads and a die paddle, and a semiconductor module disposed over the die paddle of the leadframe. The semiconductor module comprises a first semiconductor chip, and has a plurality of contact pads coupled to the first semiconductor chip. The semiconductor module is an embedded wafer level package. An encapsulant is disposed at the semiconductor module and the leadframe.

In accordance with an embodiment of the present invention, a semiconductor device comprises a semiconductor package disposed within a leadframe package. The semiconductor package is a non-standard package while the leadframe package is a standard package compliant with a standard. The semiconductor package and the leadframe package have substantially the same functionality.

In accordance with an embodiment of the present invention, a method of forming a semiconductor device comprises providing a leadframe having a plurality of leads and a die paddle. A semiconductor module comprising a first semiconductor chip disposed in a first encapsulant is provided. The semiconductor module has a plurality of contact pads coupled to the first semiconductor chip. The semiconductor module is attached to the die paddle of the leadframe. The plurality of contact pads is electrically coupled with the plurality of leads. The semiconductor module and the leadframe are encapsulated with a second encapsulant.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor package in accordance with an embodiment of the invention, wherein FIG. 1A illustrates a top view and FIG. 1B illustrates a cross-sectional view;

FIG. 2, which includes FIGS. 2A-2B, illustrates another embodiment of the semiconductor package illustrating front side redistribution lines, wherein FIG. 2A illustrates a top view and wherein FIG. 2B illustrates a cross-sectional view;

FIG. 3, which includes FIG. 3A-3E, illustrates further structural embodiments of the semiconductor package, wherein FIG. 3A illustrates the leadframe and the semiconductor module of the semiconductor package, and wherein FIG. 3B-3E illustrate examples of the semiconductor module;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the inventions enable formation of packages with standard dimensions, for example, packages that comply with JEDEC standards but also enable the integration of multiple semiconductor chips within the package without increasing packaging costs.

A structural embodiment of the present invention will be described using FIG. 1. Alternative structural embodiments of the present invention will be described using FIGS. 2, 3, and 18. Methods of formation of the semiconductor package will be described using FIGS. 4-15 and FIGS. 16-17 in accordance with embodiments of the present invention.

Figure 1A:
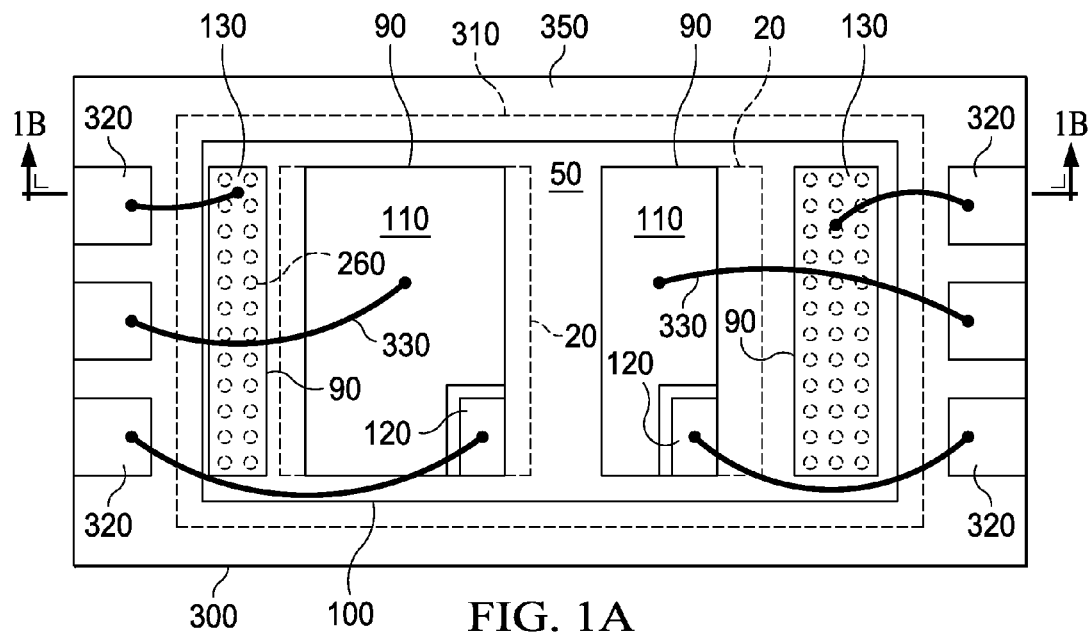
Figure 1B:
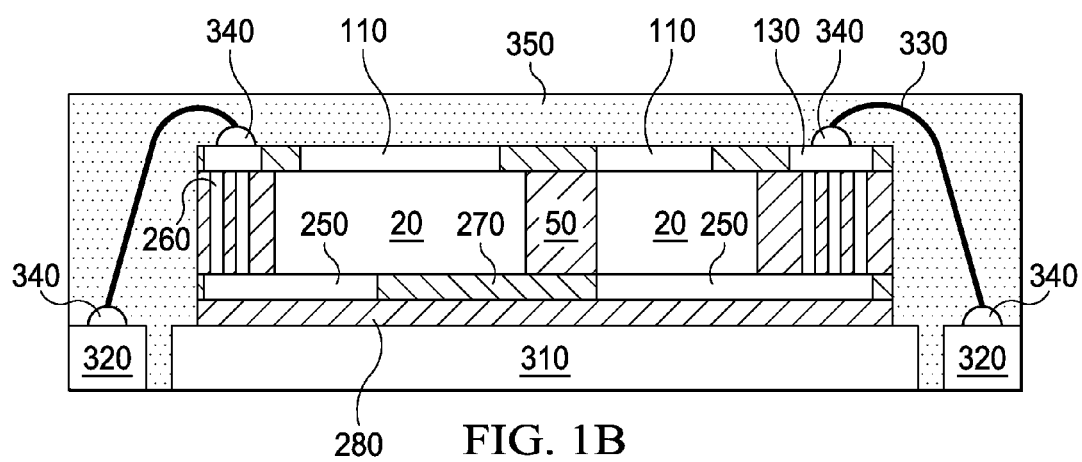
Figure 3A:
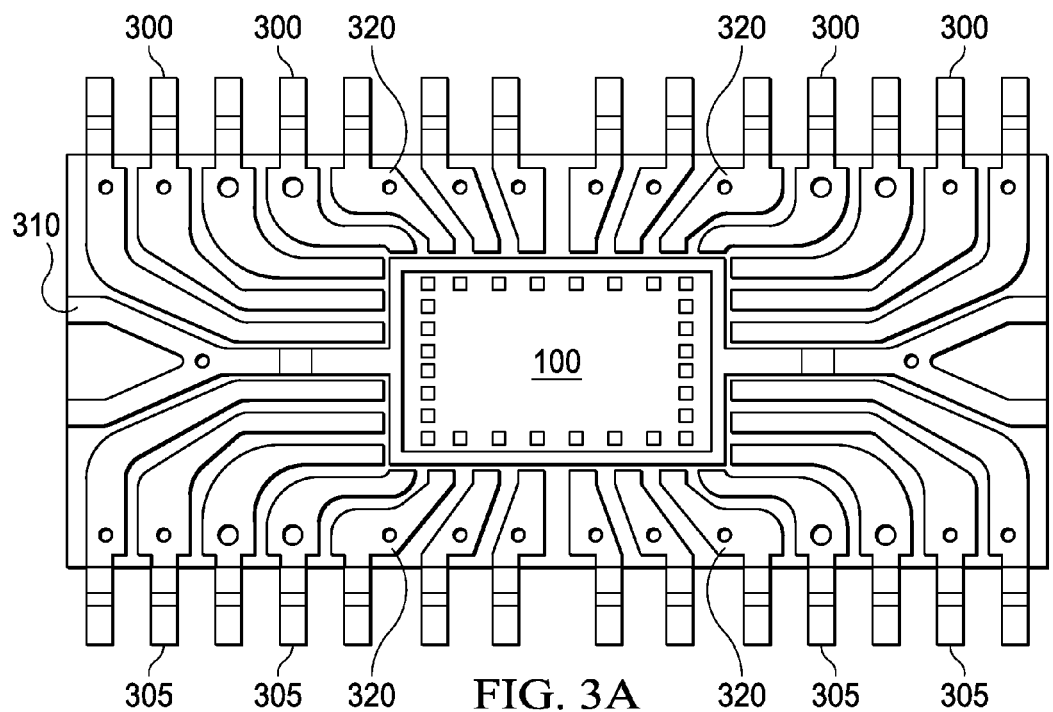
Figure 3B:
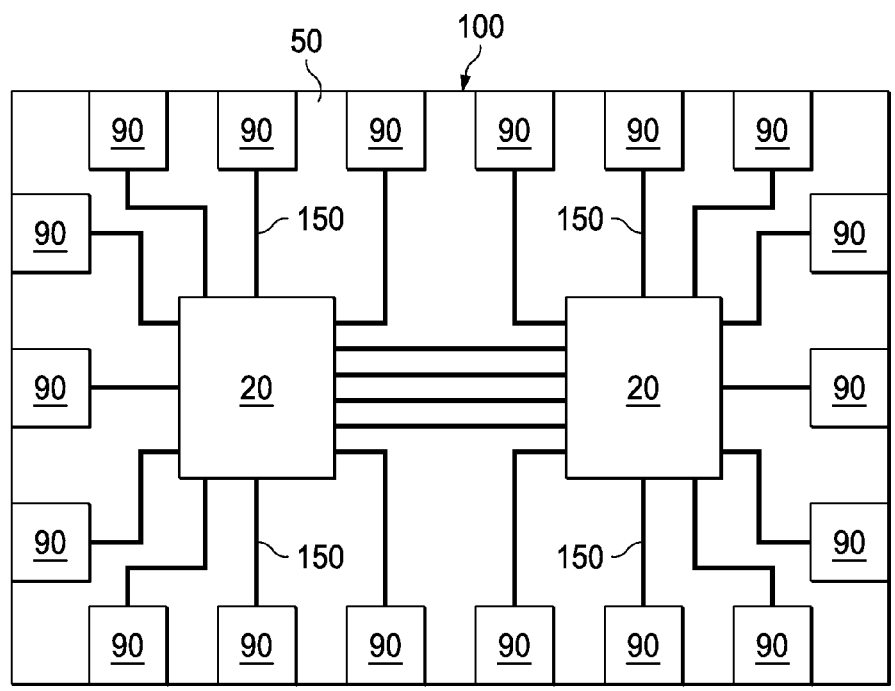
Figure 3C:
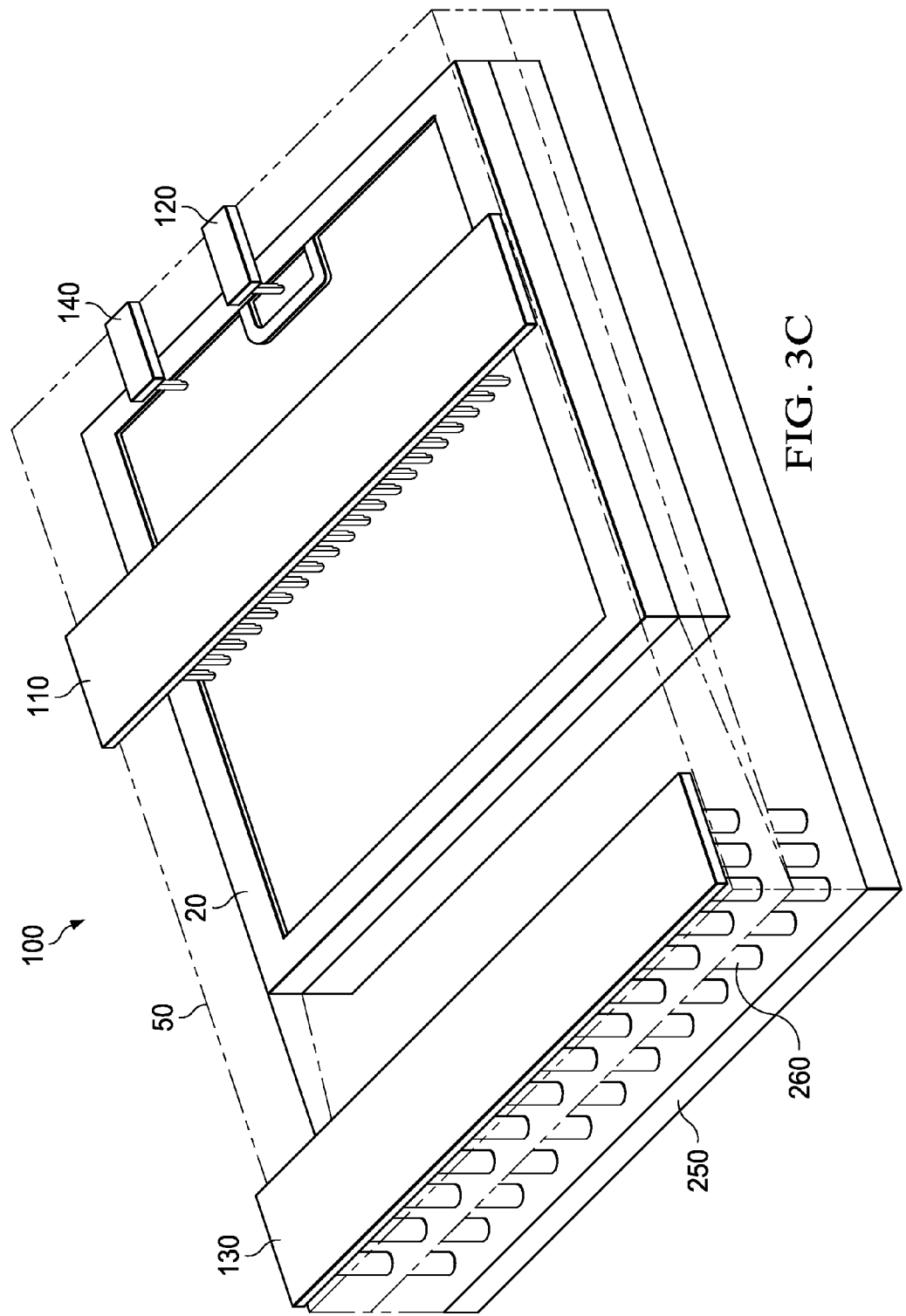
Figure 3D:
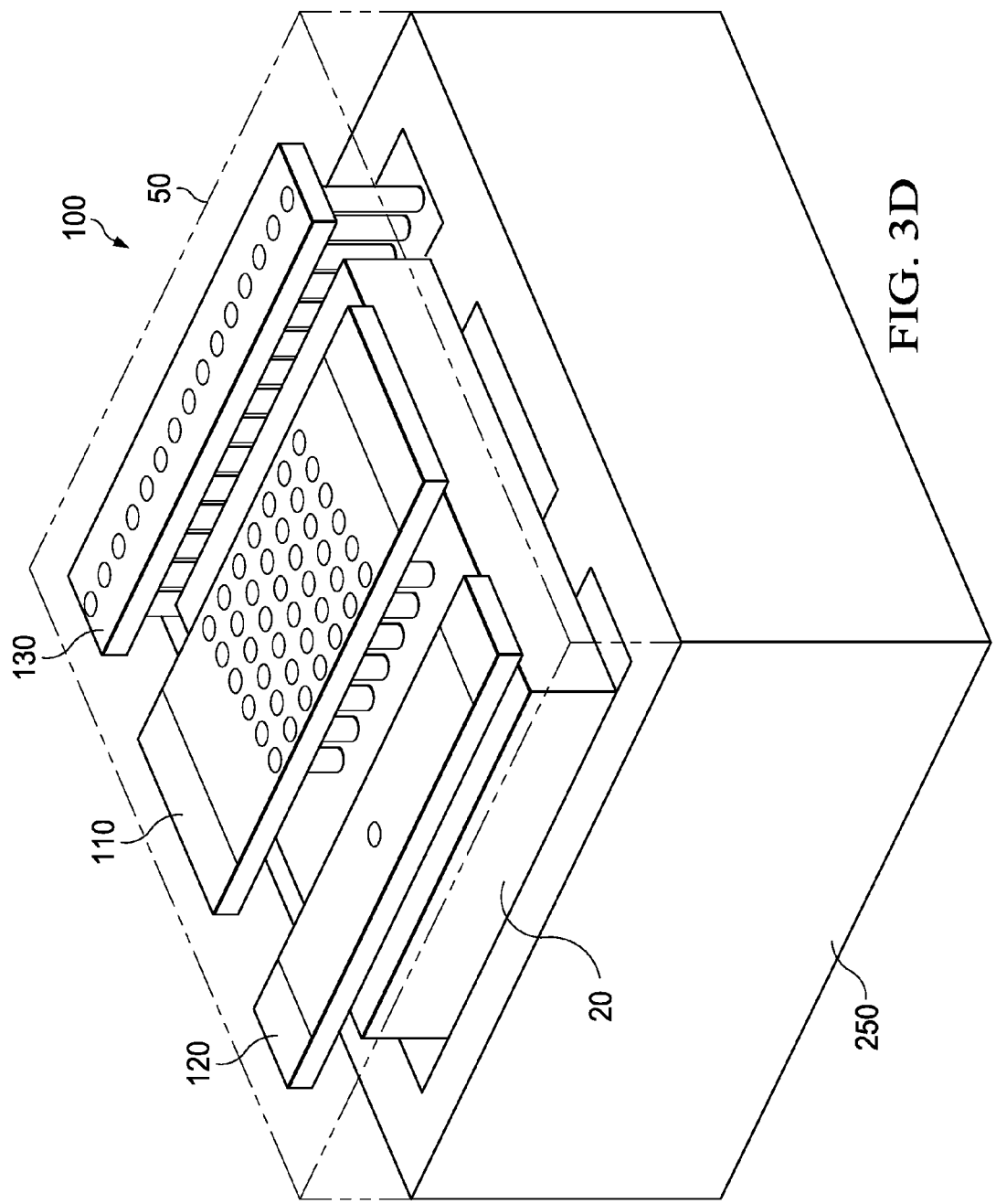
Figures 1, 3E:
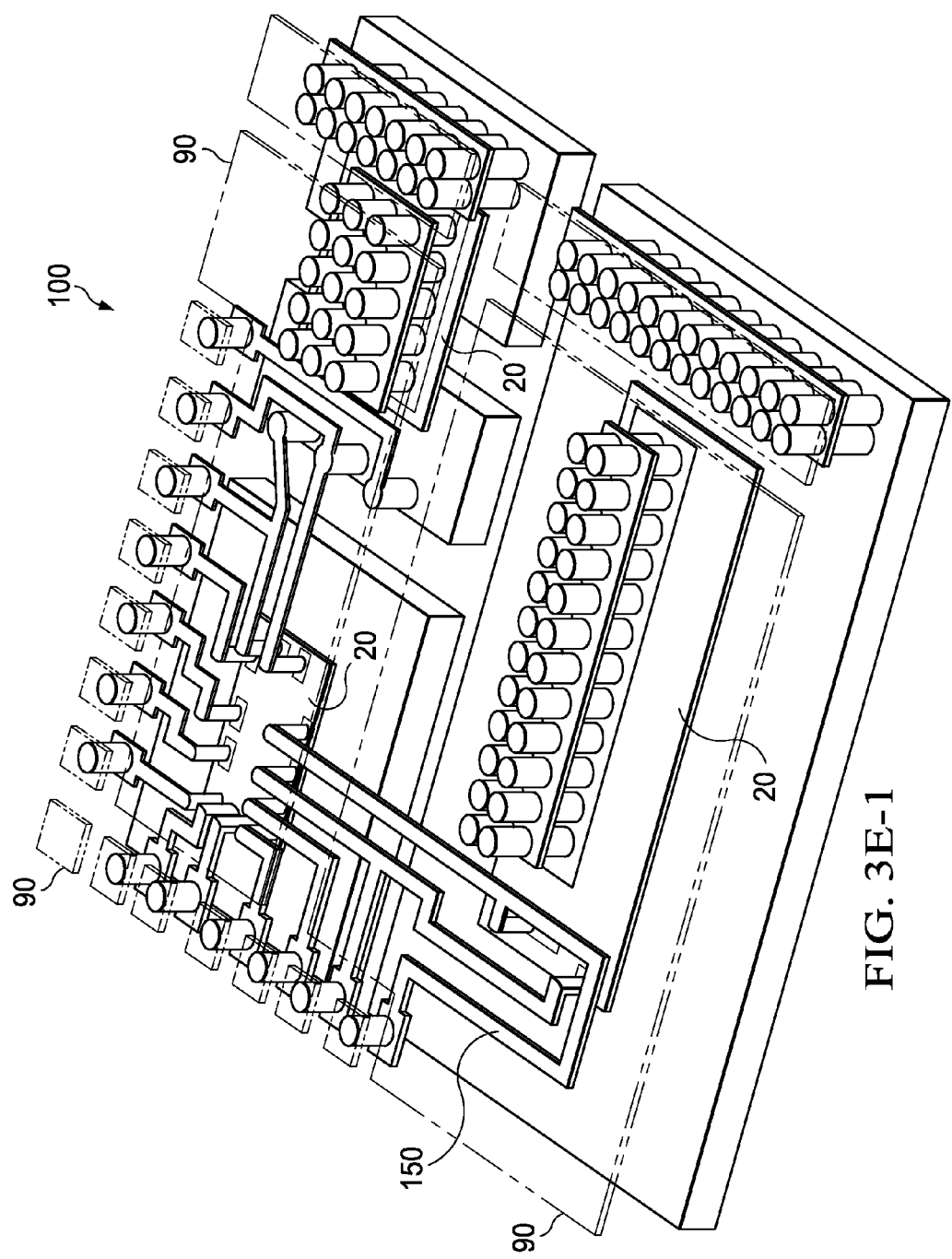

FIG. 1, which includes FIGS. 1A and 1B, illustrates a semiconductor package in accordance with an embodiment of the invention, wherein FIG. 1A illustrates a top view and FIG. 1B illustrates a cross-sectional view.

Referring to FIG. 1A, the semiconductor package comprises a leadframe 300 having a die paddle 310 and a plurality of leads 320. A semiconductor module 100 is attached to the die paddle 310 of the leadframe 300. In various embodiments, the semiconductor module 100 may comprise a plurality of semiconductor chips 20.

In various embodiments, the plurality of semiconductor chips 20 may comprise different type of dies including integrated circuits or discrete devices. In one or more embodiments, each of the plurality of semiconductor chips 20 may comprise logic chips, memory chips, analog chips, mixed signal chips, and combinations thereof such as a system on chip. The plurality of semiconductor chips 20 may comprise various types of active and passive devices such as diodes, transistors, thyristors, capacitors, inductors, resistors, optoelectronic devices, sensors, microelectromechanical systems, and others. The plurality of semiconductor chips 20 may be similar type of semiconductor chips or different types of semiconductor chips in various embodiments.

In various embodiments, the plurality of semiconductor chips 20 may be formed on a silicon substrate. Alternatively, in other embodiments, the plurality of semiconductor chips 20 may have been formed on silicon carbide (SiC). In one embodiment, the plurality of semiconductor chips 20 may have been formed at least partially on gallium nitride (GaN).

In various embodiments, the plurality of semiconductor chips 20 may comprise a power semiconductor device, which may be a discrete device in one embodiment. In one embodiment, at least some of the plurality of semiconductor chips 20 is a two terminal device such as a PIN diode or a Schottky diode. In one or more embodiments, at least some of the plurality of semiconductor chips 20 is a three terminal device such as a power metal insulator semiconductor field effect transistor (MISFET), a junction field effect transistor (JFET), bipolar junction transistor (BJT), an insulated gate bipolar transistor (IGBT), or a thyristor.

The semiconductor module 100 comprises a plurality of contact pads 90 for mounting the semiconductor module 100 over a circuit board in some embodiments. As an illustration, the plurality of contact pads 90 includes a first contact pad 110, a second contact pad 120, and a third contact pad 130 forming the contacts for one of the plurality of semiconductor chips 20. The third contact pad 130 of the plurality of contact pads 90 may be coupled to a back side of the plurality of semiconductor chips 20. For example, in one or more embodiments, the third contact pad 130 may be coupled using through substrate vias 260 disposed in the encapsulant 50. Similarly, the other chip of the plurality of semiconductor chips 20 includes a first contact pad 110, a second contact pad 120 and a third contact pad 130.

The plurality of semiconductor chips 20 may be coupled to the plurality of leads 320 using wire bonds 330 in various embodiments. In alternative embodiments, the plurality of semiconductor chips 20 may be coupled using other types of interconnects such as clips, leads, strips, and other suitable way to connect.

As illustrated in FIG. 1A, the plurality of semiconductor chips 20 within the semiconductor module 100 are embedded in an encapsulant 50. The semiconductor module 100 is itself embedded within an outer encapsulant 350.

Referring to FIG. 1B, the semiconductor module 100 is attached to the die paddle 310 of the leadframe 300 using a die attach layer 280. The die attach layer 280 may be an insulating layer or a conductive layer in various embodiments.

As illustrated in the cross-sectional view of FIG. 1B, the plurality of semiconductor chips 20 are embedded within the encapsulant 50. A first contact pad 110 is disposed over the plurality of semiconductor chips 20. A back side fill material 250 is coupled to the back side contact areas of the plurality of semiconductor chips 20. The back side fill material 50 is coupled to the front side of the semiconductor module 100 using through substrate vias 260 which are embedded in the encapsulant 50. Adjacent chips of the plurality of semiconductor chips 20 are isolated from each other by the insulating encapsulant 50. The plurality of contact pads 90 which includes the first contact pad 110 and the third contact pad 130 are coupled to the plurality of leads 320 using wire bonds 330. The wire bonds 330 may be bonded using ball or wedge-shaped solder balls 340.

In various embodiments, the semiconductor module 100 may be a package that may not be compliant with standard packaging modules such as JEDEC standards. However, in various embodiments, the lead frame package formed is compliant with standard packaging such as JEDEC standards. However, both the semiconductor module 100 and the lead frame package have similar function and operation, for example, the lead frame package may not have additional semiconductor devices besides those in the semiconductor module 100.

Figure 2A:
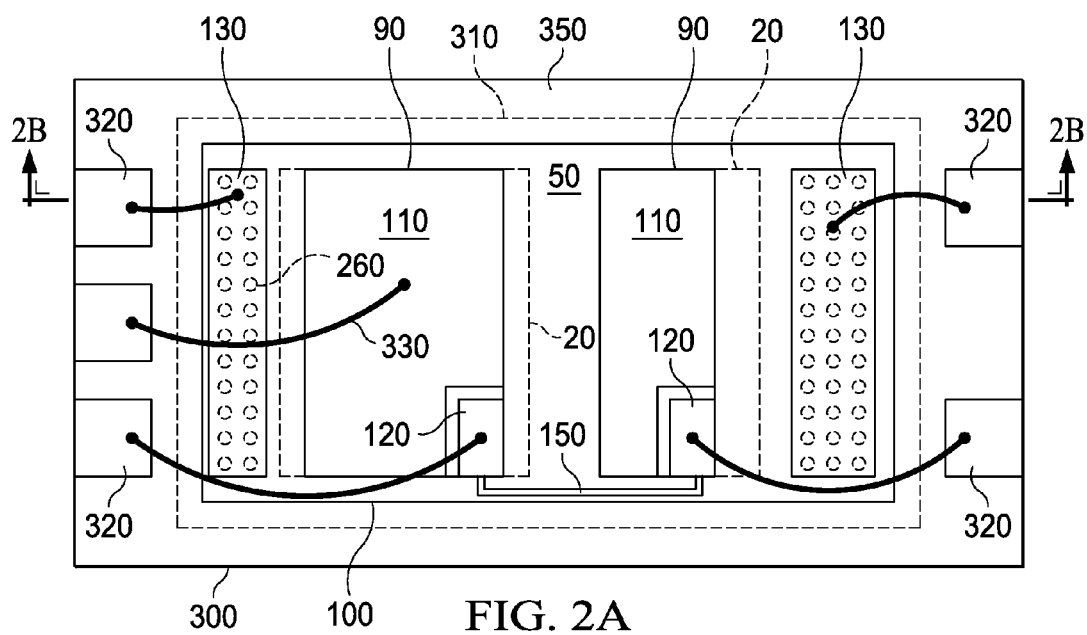
Figure 2B:
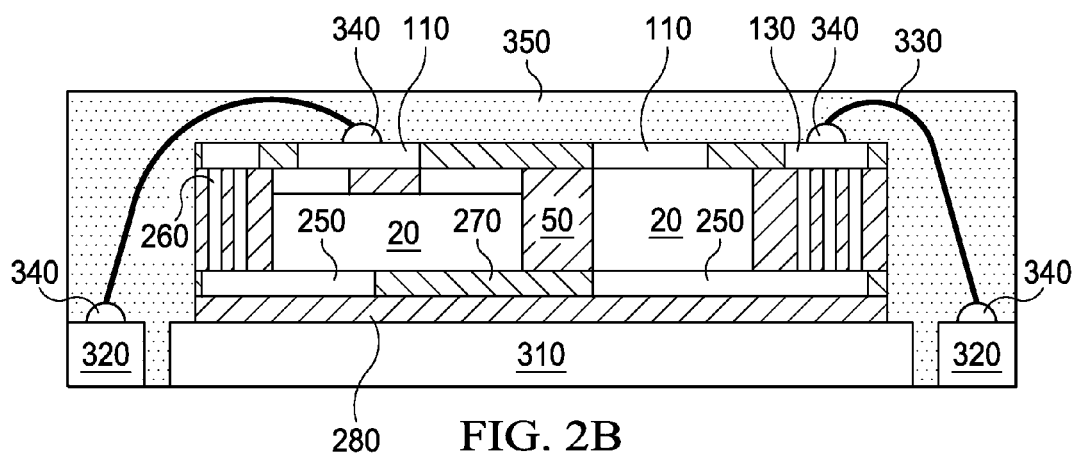
Figures 2, 3E:
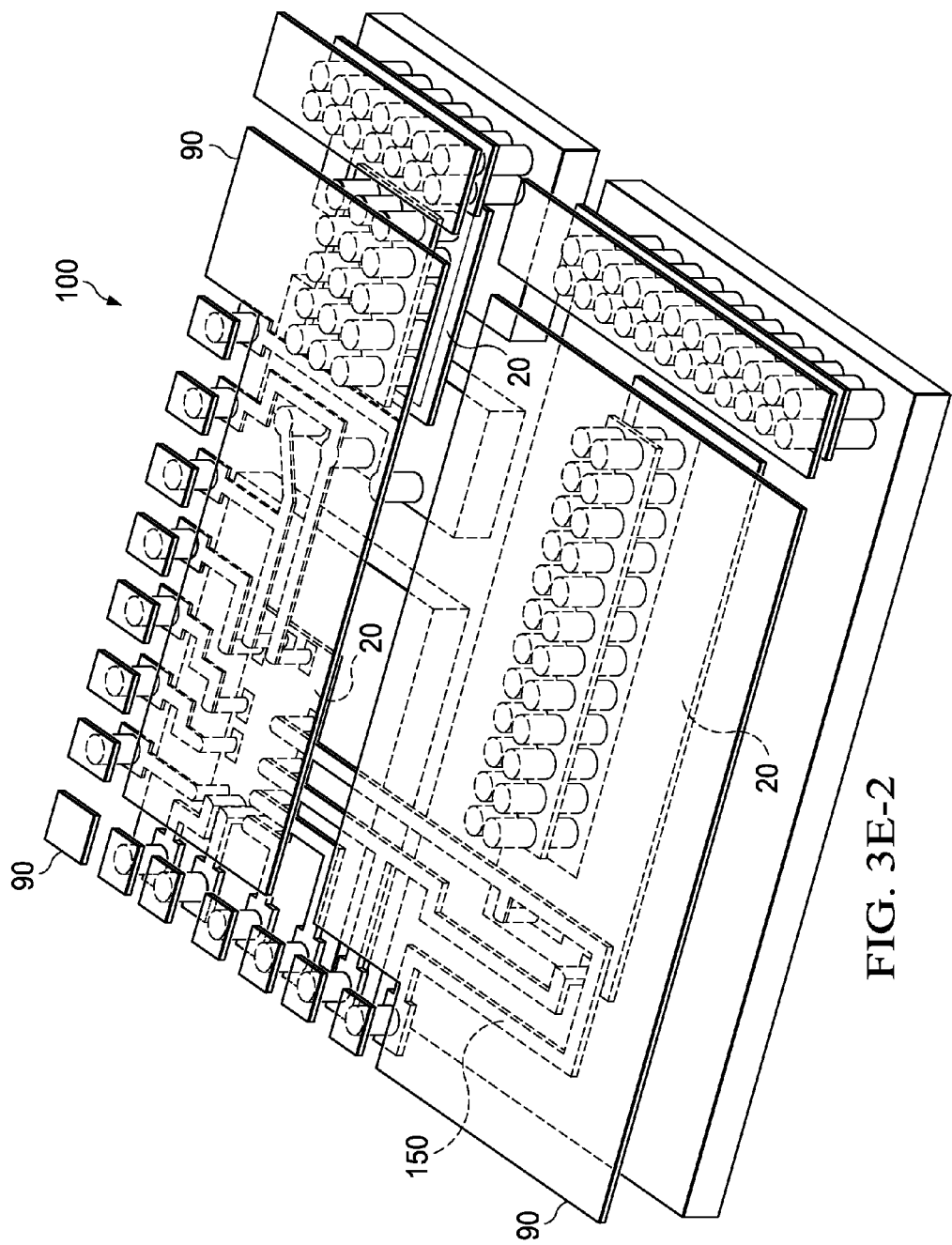

FIG. 2, which includes FIGS. 2A-2B, illustrates another embodiment of the semiconductor package illustrating front side redistribution lines, wherein FIG. 2A illustrates a top view and wherein FIG. 2B illustrates a cross-sectional view.

In addition to the embodiment described with respect to FIG. 1, the plurality of semiconductor chips 20 may be interconnected within the semiconductor module 100, for example, using front side redistribution lines 150. Thus, the number of pads of the plurality of contact pads 90 on the semiconductor module 100 may be different from the number of pins or the plurality of leads 320 of the leadframe 300. For example, as an illustration, the semiconductor module 100 has six contact pads while the lead frame 300 has only five leads.

FIG. 3, which includes FIG. 3A-3E, illustrates further structural embodiments of the semiconductor package, wherein FIG. 3A illustrates the leadframe and the semiconductor module of the semiconductor package, and wherein FIG. 3B-3E illustrate examples of the semiconductor module.

FIG. 3A illustrates the leadframe 300 having a plurality of leads 320 and die paddle 310. The leadframe 300 also includes the plurality of pins 305 extending from the plurality of leads 320. The semiconductor module 100 is disposed over the die paddle 310.

Referring to FIG. 3B, the semiconductor module 100 may include a plurality of contact pads 90 which are separated from the functional chips 25 such as logic, analog, or memory chips by the front side redistribution lines 150. As illustrated, the plurality of semiconductor chips 20 may be interconnected using the front side redistribution lines 150, which may also be used to couple to the plurality of contact pads 90.

FIG. 3C illustrates an alternative embodiment of the present invention comprising a power device such as a high voltage discrete transistor. As illustrated the plurality of contact pads 90 includes a first contact pad 110, a second contact pad 120, a third contact pad 130 which is coupled to a back side conductor, e.g., a conductive fill material 250, and a fourth contact pad 140.

FIG. 3D illustrates another alternative embodiment of the present invention comprising a low voltage integrated circuit. FIG. 3E, which includes FIGS. 3E-1 and 3E-2, illustrates a further embodiment of the present invention comprising a plurality of semiconductor chips which have been interconnected using front side redistribution lines. In FIG. 3E-1, the contact pad 90 is shown using phantom lines to highlight the features underneath the contact pad 90. FIG. 3E-2 illustrates the contact pad 90 as solid material so that the features underneath are shown in dashed lines.

FIGS. 4-15 illustrate a method of fabricating the semiconductor package in accordance with an embodiment of the present invention.

Figure 4:
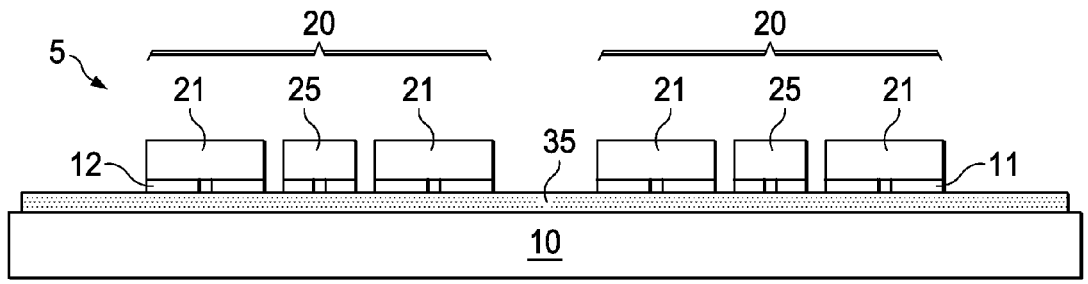
FIGS. 4-15 illustrate a cross-sectional view of a semiconductor package during various stages of fabrication in accordance with an embodiment of the present invention.

FIG. 4 illustrates a semiconductor package during fabrication after placing singulated dies over a carrier in accordance with an embodiment of the invention.

Referring to FIG. 4, a plurality of semiconductor chips 20 are placed over a carrier 10. In various embodiments, the first surface 11 of the plurality of semiconductor chips 20 having active regions is placed facing the carrier 10 as illustrated in FIG. 4.

The plurality of semiconductor chips 20 may be formed using conventional processing, for example, within a wafer, which is diced to form the plurality of semiconductor chips 20. As described above, the plurality of semiconductor chips 20 may be formed on a silicon substrate such as a bulk silicon substrate or a silicon on insulator (SOI) substrate. Alternatively, the semiconductor chip 20 may be a device formed on silicon carbide (SiC). Embodiments of the invention may also include devices formed on compound semiconductor substrates and may include devices on hetero-epitaxial substrates. In one embodiment, the semiconductor chip 20 is a device formed at least partially on gallium nitride (GaN), which may be a GaN on sapphire or silicon substrate.

In various embodiments, the plurality of semiconductor chips 20 may comprise power chips, which, for example, draw large currents (e.g., greater than 30 amperes). In various embodiments, the plurality of semiconductor chips 20 may comprise discrete vertical devices such as a two or a three terminal power device. Examples of the plurality of semiconductor chips 20 include PIN or Schottky diodes, MISFET, JFET, BJT, IGBT, or thyristor. In various embodiments, the plurality of semiconductor chips 20 may comprise a combination of power chips 21 with functional chips 25 such as logic or memory chips.

In various embodiments, the power chips 21 may be a vertical semiconductor device configured to operate at about 20 V to about 1000 V. In one embodiment, the power chips 21 are configured to operate at about 20 V to about 100 V. In another embodiment, the power chips 21 are configured to operate at about 100 V to about 500 V. In yet another embodiment, the power chips 21 are configured to operate at about 500 V to about 1000 V. In one embodiment, the power chips 21 are an NPN transistor. In another embodiment, the power chips 21 are a PNP transistor. In yet another embodiment, the power chips 21 are an n-channel MISFET. In a further embodiment, the power chips 21 are a p-channel MISFET. In one or more embodiments, the power chips 21 may comprise a plurality of devices such as a vertical MISFET and a diode, or alternatively two MISFET devices separated by an isolation region.

The thickness of the plurality of semiconductor chips 20 from the top surface 11 to the bottom surface 12 may be less than 50 µm in various embodiments. The thickness of the plurality of semiconductor chips 20 from the top surface 11 to the bottom surface 12 may be less than 20 µm in one or more embodiments. The thickness of the plurality of semiconductor chips 20 from the top surface 11 to the bottom surface 12 may be less than 10 µm in one or more embodiments.

Next, the plurality of semiconductor chips 20 is attached to the carrier 10, which provides mechanical support and stability during processing. In various embodiments, the carrier 10 may be a plate made of a rigid material, for example, a metal such as nickel, steel, or stainless steel, a laminate, a film, or a material stack. The carrier 10 may have at least one flat surface over which the plurality of semiconductor chips 20 may be placed. In one or more embodiments, the carrier 10 may be round or square-shaped although in various embodiments the carrier 10 may be any suitable shape. The carrier 10 may have any appropriate size in various embodiments. In some embodiments, the carrier 10 may include an adhesive tape, for example, a double sided sticky tape laminated onto the carrier 10. The carrier 10 may comprise a frame, which is an annular structure (ring shaped) with an adhesive foil in one embodiment. The adhesive foil may be supported along the outer edges by the frame in one or more embodiments.

The plurality of semiconductor chips 20 may be attached using an adhesive layer 35 in various embodiments. In various embodiments, the adhesive layer 35 may comprise glue or other adhesive type material. In various embodiments, the adhesive layer 35 may be thin, for example, less than about 100 µm in one embodiment and between 1 µm to about 50 µm in another embodiment.

Figure 5:
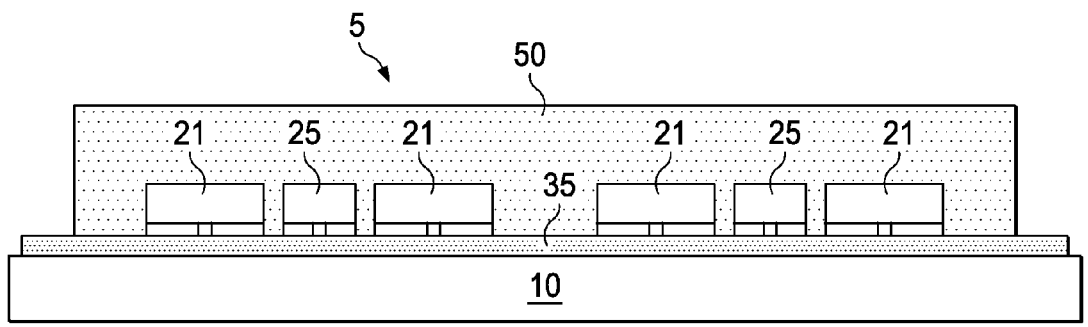

FIG. 5 illustrates the semiconductor package during fabrication after forming a reconstituted wafer in accordance with an embodiment of the invention.

As illustrated in FIG. 5, an encapsulant 50 is applied over the plurality of semiconductor chips 20 and partially encloses the plurality of semiconductor chips 20. In one embodiment, the encapsulant 50 is applied using a molding process such as compression molding, transfer molding process, injection molding, granulate molding, powder molding, liquid molding, as well as printing processes such as stencil or screen printing.

In various embodiments, the encapsulant 50 comprises a dielectric material and may comprise a mold compound in one embodiment. In other embodiments, the encapsulant 50 may comprise one or more of a polymer, a copolymer, a biopolymer, a fiber impregnated polymer (e.g., carbon or glass fibers in a resin), a particle filled polymer, and other organic materials. In one or more embodiments, the encapsulant 50 comprises a sealant not formed using a mold compound, and materials such as epoxy resins and/or silicones. In various embodiments, the encapsulant 50 may be made of any appropriate duroplastic, thermoplastic, a thermosetting material, or a laminate. The material of the encapsulant 50 may include filler materials in some embodiments. In one embodiment, the encapsulant 50 may comprise epoxy material and a fill material comprising small particles of glass or other electrically insulating mineral filler materials like alumina or organic fill materials. The encapsulant 50 may be cured, i.e., subjected to a thermal process to harden thus forming a hermetic seal protecting the plurality of semiconductor chips 20. The curing process hardens the encapsulant 50 thereby forming a single substrate holding the plurality of semiconductor chips 20. Such a substrate is referred as a reconstituted wafer 5.

Figure 6:
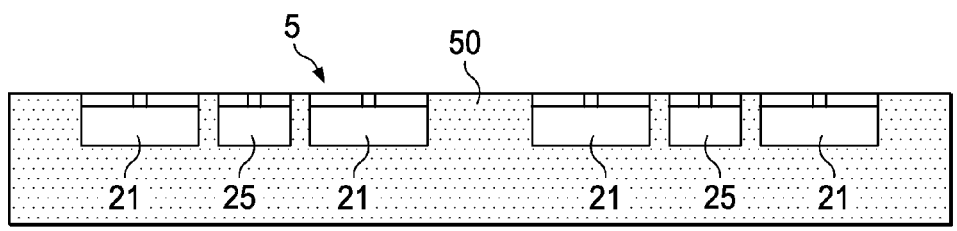

FIG. 6 illustrates the semiconductor package, during fabrication, after separating the reconstituted wafer from the carrier in accordance with an embodiment of the invention.

Referring to FIG. 6, the carrier 10 is removed to separate the reconstituted wafer 5 or artificial wafer. The encapsulant 50 provides mechanical and thermal stability during subsequent processing. Removing the carrier 10 also exposes the front surface of the semiconductor chip 20. During subsequent processing, the reconstituted wafer 5 may be subjected to temperatures as high as 300° C. depending on the thermal stability of the encapsulant 50 in various embodiments.

Figure 7:
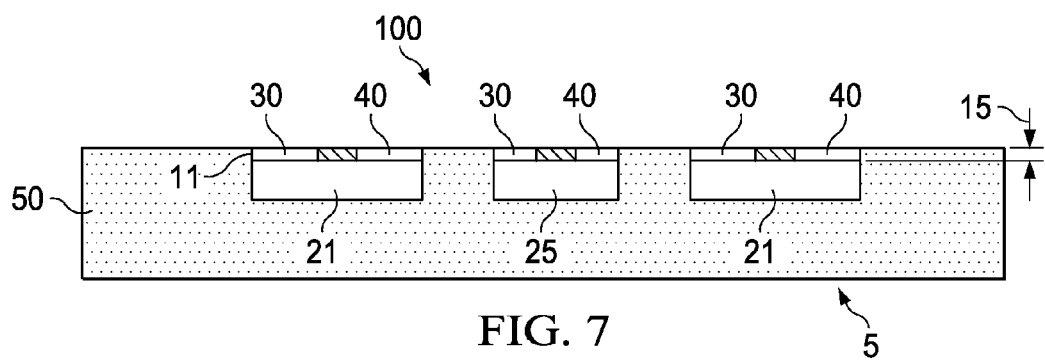

FIG. 7 illustrates a magnified cross-sectional view of the semiconductor package during fabrication showing front side metallization in accordance with an embodiment of the invention. Unlike FIGS. 4-6, FIG. 7 illustrates a magnified view of a single semiconductor package.

Referring to FIG. 7, the plurality of semiconductor chips 20 may include a front side metallization layer 15, for example, may comprise a first contact region 30 and a second contact region 40. The front side metallization layer 15 is formed over the top surface 11 of the plurality of semiconductor chips 20. In various embodiments, the front side metallization layer 15 may be formed prior to dicing of the wafer. Alternatively, in some embodiments, the front side metallization layer 15 may be formed at this stage of processing. The first contact region 30 and the second contact region 40 may comprise a plurality of layers. In one embodiment, silicide regions may cover a semiconductor material of the plurality of semiconductor chips 20. A barrier layer may be formed over the silicide regions followed by a metal layer. In one embodiment, the first contact region 30 and the second contact region 40 may comprise copper. In another embodiment, the first contact region 30 and the second contact region 40 may comprise aluminum. In various embodiments, the first contact region 30 and the second contact region 40 may comprise titanium, tantalum, tungsten, and nitrides thereof.

Figure 8:
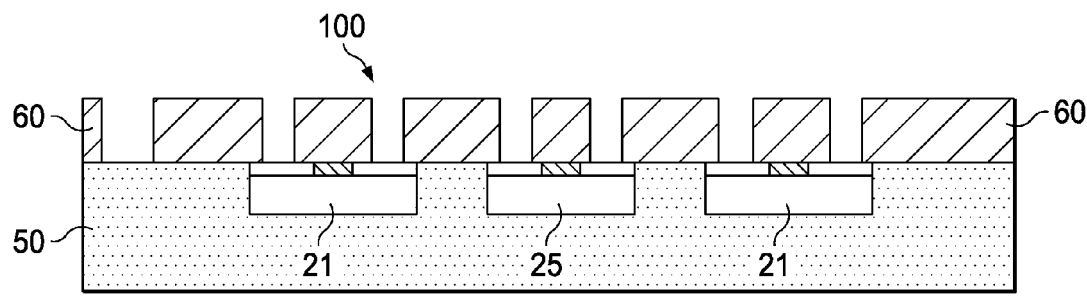

FIG. 8 illustrates a magnified view of the semiconductor package during formation of front side redistribution layer in accordance with an embodiment of the invention.

A passivation layer 60 may formed around the front side metallization layer 15 and patterned forming redistribution lines and contact pads. In various embodiments, the passivation layer 60 is an insulating layer. In one or more embodiments, the passivation layer 60 may comprise an oxide layer or an oxide/nitride layer stack. In other embodiments, the passivation layer 60 may comprise silicon nitride, silicon oxynitride, FTEOS, SiCOH, polyimide, photoimide, BCB or other organic polymers, or combinations thereof. An optional insulating liner may be formed above the passivation layer 60. The optional insulating liner may comprise a nitride layer, in one embodiment. In various embodiments, the optional insulating liner may comprise FTEOS, $SiO_2$, SiCOH, or other low-k materials. Using a photolithography process, the passivation layer 60 is patterned to open the bond pads on the last metal level of the plurality of semiconductor chips 20.

Figure 9:
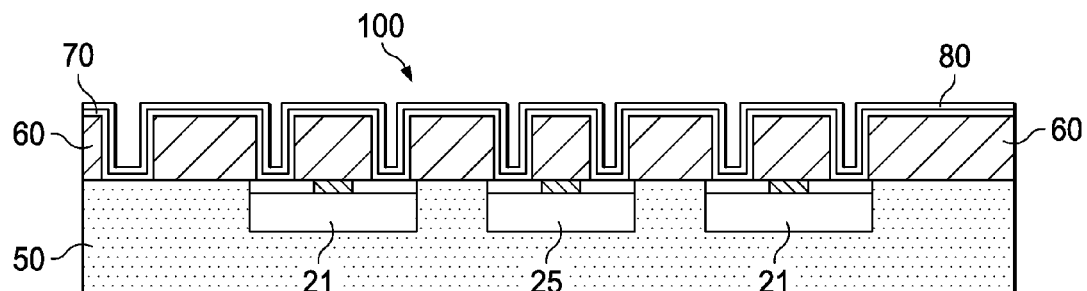

FIG. 9 illustrates a magnified view of the semiconductor package during fabrication after formation of front side redistribution layer in accordance with an embodiment of the invention.

Referring to FIG. 9, a conductive liner 70 is deposited. In various embodiments, the conductive liner 70 is deposited using a deposition process to form a conformal layer comprising Ti, Ta, Ru, W, combinations thereof, or a nitride, silicide, carbide thereof. Examples of such combinations include TiN, TaN, and WN, and TiW. In various embodiments, the conductive liner 70 is deposited using a chemical vapor deposition, plasma vapor deposition or atomic layer deposition. In various embodiments, the conductive liner 70 comprises a thickness of about 20 nm to about 200 nm. The conductive liner 70 is a diffusion barrier metal and prevents out-diffusion of copper from the last metal line of the front side metallization layer 15 as well as prevents intermixing with further metallic layers.

As further illustrated in FIG. 9, a conductive seed layer 80 is deposited. The conductive seed layer 80 covers the conductive liner 70. In various embodiments, the conductive seed layer 80 is deposited using a deposition process to form a conformal layer. In various embodiments, the conductive seed layer 80 is deposited using a chemical vapor deposition, plasma vapor deposition or atomic layer deposition. In various embodiments, the conductive seed layer 80 comprises a thickness of about 20 nm to about 200 nm. The conductive seed layer 80 provides the seed layer for the growth during the subsequent electroplating process. In various embodiments, the conductive seed layer 80 may comprise copper or other metals like Al, W, Ag, Au, Ni, or Pd.

Figure 10:
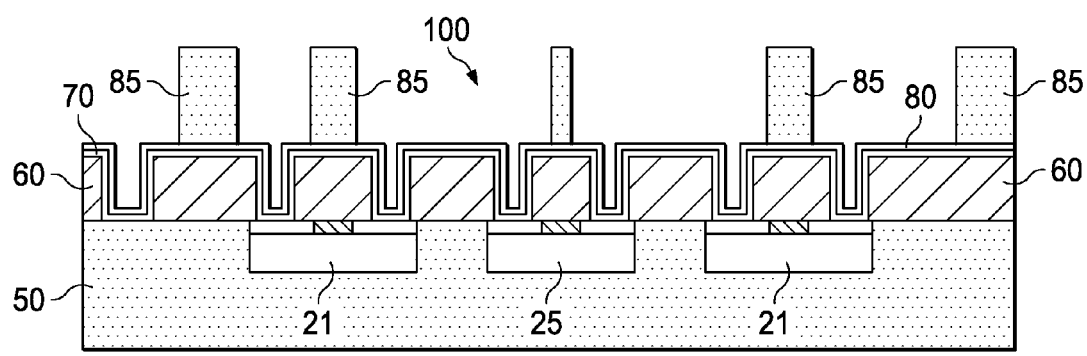

As next illustrated in FIG. 10, a thick photo resist layer 85 is deposited. In various embodiments, the photo resist layer 85 is several microns thick, and varies from about 1 μm to about 10 μm, in one embodiment. After deposition, the photo resist layer 85 fills the openings previously formed in the passivation layer 60. The photo resist layer 85 is exposed and developed. The patterned photo resist layer 85 comprises patterns for redistribution metal lines and contact pads.

Figure 11:
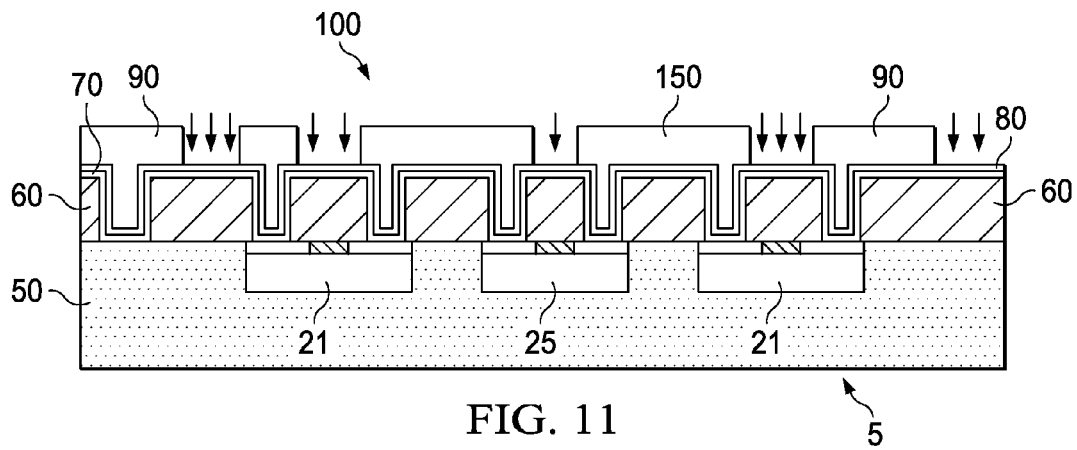

Referring next to FIG. 11, front side redistribution metal lines 150 and contact pads 90 are formed by electroplating a fill metal over the conductive seed layer 80 exposed between the patterned photo resist layer 85. In various embodiments, the fill metal comprises copper, although in some embodiments, other suitable conductors are used. The conductive seed layer 80 may comprise the same material as the material of the subsequent metal lines to enable electroplating, in one embodiment. In various embodiments, the front side redistribution metal lines 150 may comprise multiple layers, for example, Cu/Ni, Cu/Ni/Pd/Au, Cu/NiMoP/Pd/Au, or Cu/Sn, in one embodiment.

The patterned photo resist layer 85 is stripped to expose the conductive seed layer 80. The exposed conductive seed layer 80 and the underlying conductive liner 70 are etched away (as illustrated by the arrows), for example, using a wet etch chemistry. The structure at this stage is illustrated in FIG. 11 and includes contact pads 90 and front side redistribution metal lines 150.

Figure 12:
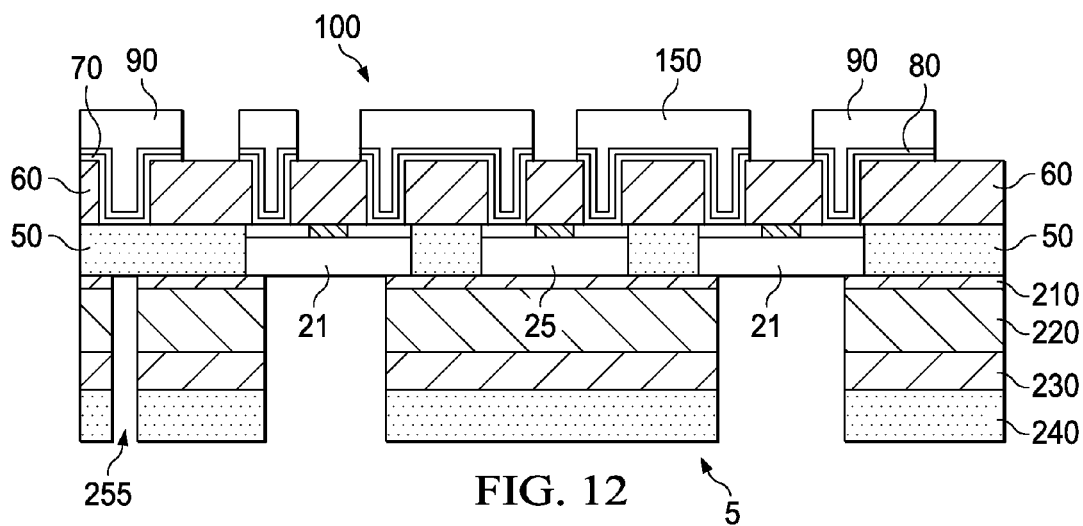

Referring to FIG. 12, the reconstituted wafer 5 comprising the semiconductor module 100 being formed is thinned from the back side thereby exposing the plurality of semiconductor chips 20. The thinning of the reconstituted wafer 5 may also thin the plurality of semiconductor chips 20 in some embodiments. The thinning may be performed using a mechanical process, a chemical process, a chemical mechanical process in various embodiments.

A dielectric liner 210 is deposited over the lower surface of the reconstituted wafer 5. A back side insulating layer 220 may be deposited over the dielectric liner 210. A resist layer 240 is spun over the back side insulating layer 220. In one or more embodiments, a hard mask layer 230 may be deposited on the back side insulating layer 220 between the back side insulating layer 220 and the resist layer 240. The hard mask layer 230 may be a single layer or comprise multiple layers. The hard mask layer 230 protects the plurality of semiconductor chips 20 and the back side insulating layer 220 during the through substrate opening etch. The hard mask layer 230 may be selected based on the selectivity to the through substrate opening etch process. For example, in one embodiment, a high density plasma with a fluorine chemistry is used to etch the through substrate opening, and the hard mask layer 230 comprises a $SiO_2$ hard mask.

The resist layer 240 is exposed and patterned. The hard mask layer 230, the underlying back side insulating layer 220 and the dielectric liner 210 are etched to expose a lower surface of the plurality of semiconductor chips 20 using the patterned resist layer 240 as a mask. The through substrate openings 255 are formed within the encapsulant 50 and contacts a contact pad 90.

As illustrated in FIG. 12, a high density plasma process in an RF plasma chamber may be used to form through substrate openings 255 in the encapsulant 50. An etch step is carried out using a fluorine based plasma. However, fluorine based etches are isotropic and may result in non-vertical sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ions. The through substrate opening process is carried out in sequential etch and deposition steps. A vertical opening may thus be produced. For example, the fluorine etch step may comprise a $SF_6$ etchant, whereas the polymer producing gas may comprise $C_4F_8$. The etch and deposit steps may be repeated many times, e.g., about 100 times to about 500 times, to form the through substrate opening 255. In other embodiments, other types of reaction ion etch processes may be used. After the etch step, the through substrate opening 255 may comprise any suitable vertical shape such as cylindrical, annular, faceted, trench etc. The end point of the etch process may be determined from an analysis (e.g., optically) during etching and may be timed in some embodiments.

Figure 13:
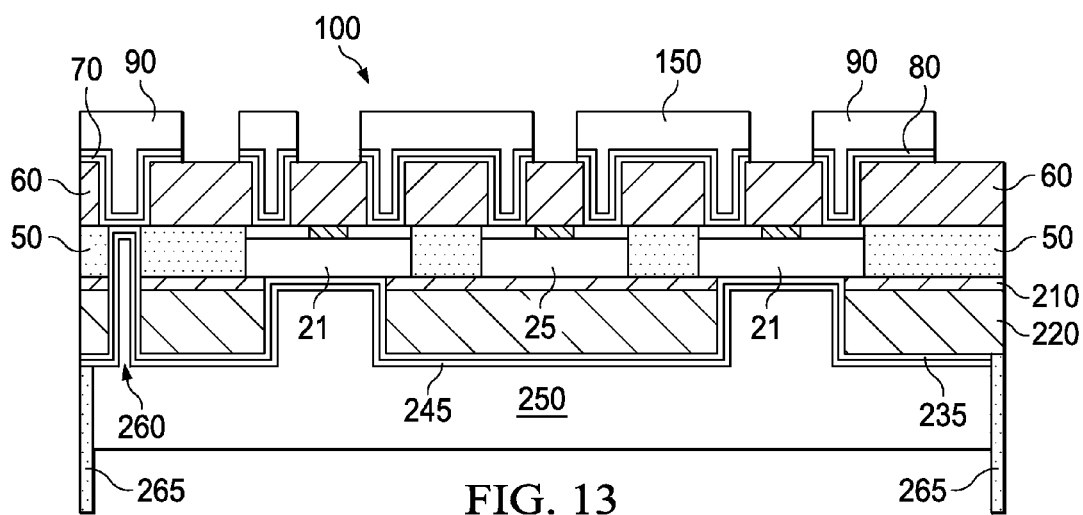

Referring to FIG. 13, any remaining resist layer 240 and hard mask layer 230 are removed, exposing the back side insulation layer 220. An optional sidewall dielectric layer may be deposited in the sidewalls of the through substrate opening 255. A barrier liner 235 is deposited prior to filling the through substrate opening 255 with a conductive fill material. The barrier liner 235 is conformal, and may comprise a single layer of Ta, TaN, W, WN, WCN, WSi, Ti, TiN and/or Ru as examples. The barrier liner 235 may be used as a barrier layer for preventing metal from diffusing into the underlying plurality of semiconductor chips 20 and/or the encapsulant 50. The barrier liner 235 may be deposited, for example, using RF magnetron sputtering. A back side seed layer 245 may be optionally deposited over the barrier liner 235. This back side seed layer 245 may be deposited conformally, for example, using a PVD sputtering or a metal-organic CVD (MOCVD) process.

A photo resist layer 265 is deposited on the back surface of the reconstituted wafer 5. In various embodiments, the photo resist layer 265 is a thick layer of photo resist comprising a thickness of several microns. The photo resist layer 265 is patterned using a photo lithography step. The photo lithography step is performed through a mask with patterns for back side redistribution lines and through substrate openings 255. The photo lithography step exposes the barrier liner 235 and the optional back side seed layer 245.

As illustrated in FIG. 13, a backside redistribution layer is formed by depositing a back side conductive fill material 250 on the back side seed layer 245, for example, using an electroplating process. The back side conductive fill material 250 is thus deposited in between the patterned photo resist layer 265. The back side conductive fill material 250 is thus deposited both inside the through substrate opening 255 and on patterns for back side redistribution lines. In some embodiments, the back side conductive fill material 250 may partially fill the through substrate opening 255.

In one embodiment, the back side conductive fill material 250 comprises copper. In one or more embodiments, the back side conductive fill material 250 comprises copper, silver, gold, nickel, zinc, and/or platinium. In a different embodiment, the back side conductive fill material 250 comprises tungsten. If the back side conductive fill material 250 comprises tungsten, preferably a bi-layer seed layer comprising CVD titanium nitride and silicon doped tungsten are used. Similarly, in some embodiments, doped poly-silicon, silver, gold and/or aluminum may be deposited inside the through substrate opening 255 to form the through substrate vias 260. Remaining photo resist layer 265 is stripped to expose the back side seed layer 245. The back side seed layer 245 and the barrier liner 235 are removed by wet or dry etching to expose the underlying back side insulating layer 220.

In an alternative embodiment, the back side conductive fill material 250 may be deposited and patterned using a subtractive etch process. In a further embodiment, the back side redistribution layer may be printed directly, for example, using stencil printing or screen printing.

The reconstituted wafer 5 is singulated thereby forming individual semiconductor module 100. The semiconductor module 100 comprises a plurality of contact pads 90 for forming external contacts.

The semiconductor module 100 thus being formed may be tested prior to subsequent packaging. For example, a test probe may be applied over the contact pads 90 to identify defective units.

The semiconductor module 100 thus formed may be used directly and mounted on a circuit board in some embodiments. In other embodiments, the semiconductor module 100 may be packaged over a lead frame, clip frame, and other suitable substrates, to form a semiconductor package. Embodiments of the invention include forming any suitable type of packages, for example, compatible with JEDEC standards. Examples include transistor outline packages, small outline packages, thin small outline packages, thin shrink small outline packages, single in line packages, and others.

Figure 14:
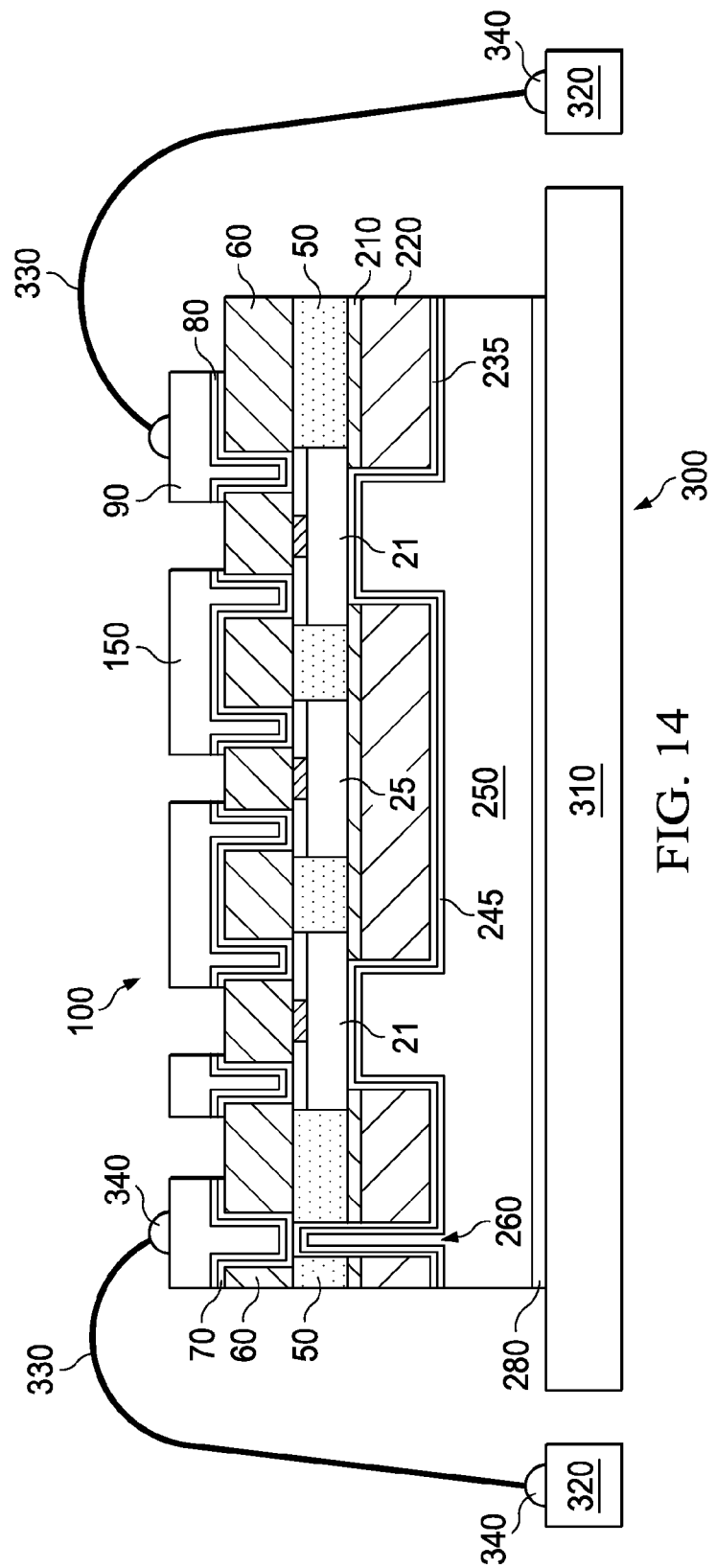

Referring to FIG. 14, a semiconductor module 100, for example, as formed in FIG. 13, is placed over a lead frame 300. The semiconductor module 100 may be attached to the lead frame 300 using an die attach layer 280, which may be insulating in one embodiment. In some embodiments, the die attach layer 280 may be conductive, for example, may comprise a nano-conductive paste. In alternative embodiments, the back side conductive fill material 250 may be soldered to the lead frame 300 so that the die attach layer 280 is a solderable material.

In one embodiment, the die attach layer 280 comprises a polymer such as a cyanide ester or epoxy material and may comprise silver particles. In one embodiment, the die attach layer 280 may be applied as conductive particles in a polymer matrix so as to form a composite material after curing. In an alternative embodiment, a conductive nano-paste such as a silver nano-paste may be applied. Alternatively, in another embodiment, the die attach layer 280 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the die attach layer 280.

The die attach layer 280 may be dispensed in controlled quantities under the semiconductor module 100. An die attach layer 280 having a polymer may be cured at about 125° C. to about 200° C. while solder based die attach layer 280 may be cured at 250° C. to about 350° C. Using the die attach layer 280, the semiconductor module 100 is attached to the die paddle 310 of the leadframe 300.

In one or more embodiments, the contact pads 90 on the semiconductor module 100 are coupled to the lead frame 300 using wire bonds 330 using a wire bonding process. The wire bonds 330 may be soldered to the leads 320 of the leadframe 300 and the contact pads 90 using solder balls 340.

In one or more embodiments, the wire bonds 330 may comprise aluminum or copper. The thickness of such aluminum wires may be about 10 μm to about 1000 μm in one or more embodiments. In another embodiment, the wire bonds 330 may comprise gold. The thickness of such gold wires may be about 10 μm to about 100 μm.

In one or more embodiments, high-speed wire bond equipment may be used to minimize the time of forming the wire bonds 330. Image recognition systems may be used to orient the semiconductor module 100 during the wire bonding process in some embodiments.

In various embodiments, ball bonding or wedge bonding may be used to attach the wire bonds 330. In various embodiments, the wire bonds 330 may be formed using thermosonic bonding, ultrasonic bonding, or thermo-compression bonding. Thermosonic bonding utilizes temperature, ultrasonic, and low impact force, and ball/wedge methods. Ultrasonic bonding utilizes ultrasonic and low impact force, and the wedge method only. Thermo-compression bonding utilizes temperature and high impact force, and the wedge method only.

For example, in one case, thermosonic bonding may be used with gold and copper wires. Two wire bonds are formed for each interconnection, one at contact pads 90 of the semiconductor module 100 and another at a lead of the plurality of the leads 320 of the lead frame 300. Bonding temperature, ultrasonic energy, and bond force and time may have to be closely controlled to form a reliable connection from the semiconductor module 100 to the lead frame 300.

In one or more embodiments, a solder flux and a solder material may be deposited for the wire bonding process. The solder material may be electroplated, although, in other embodiments, other processes such as electroless plating or deposition processes such as vapor deposition may also be used. The solder material may be a single layer or comprise multiple layers with different compositions. For example, in one embodiment, the solder material may comprises a lead (Pb) layer followed by a tin (Sn) layer. In another embodiment, a SnAg may be deposited as the solder material. Other examples include SnPbAg, SnPb, PbAg, PbIn, and lead free materials such as SnBi, SnAgCu, SnTn, and SiZn. In various embodiments, other suitable materials may be deposited.

A thermal treatment may be performed to form the solder balls 340 illustrated in FIG. 14. The thermal treatment reflows the solder material and the heating forms the solder balls 340. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, lead free solder balls 340 may be formed having a composition of 97.5 Sn/2.6 Ag (97.5/2.5). The solder balls 340 comprise a homogeneous material and have a well-defined melting temperature. For example, the high melting Pb/Sn alloys are reliable metallurgies which are resistant to material fatigue. The metal from the contact pads 90 may also diffuse and intermix during the thermal treatment in some embodiments.

Figure 15:
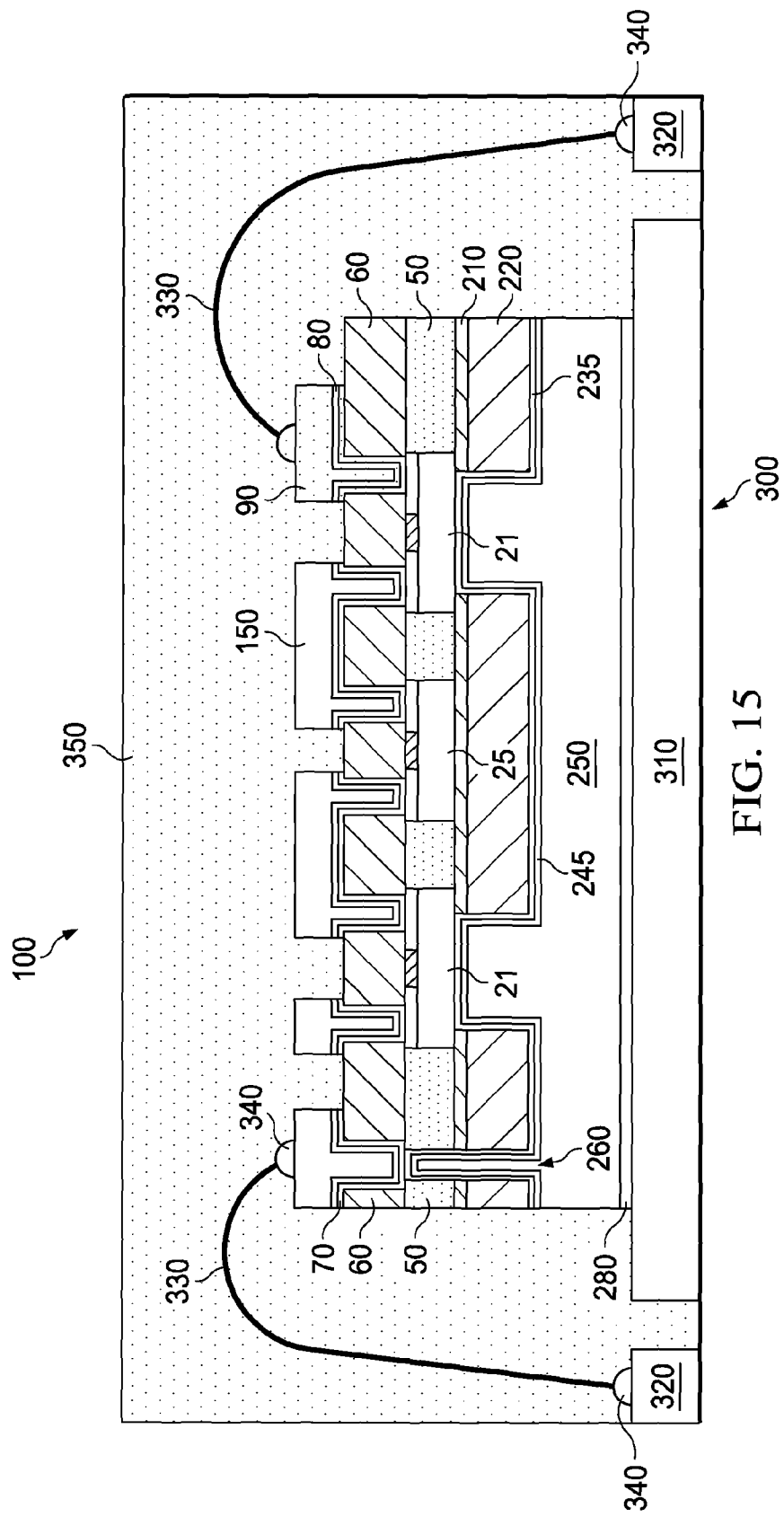

Referring to FIG. 15, an outer encapsulant 350 is applied over the semiconductor module 100 and the lead frame 300. In one or more embodiments, the outer encapsulant 350 may be applied using a compression molding process. In compression molding, the outer encapsulant 350 may be placed into a molding cavity, then the molding cavity is closed to compress the outer encapsulant 350. Compression molding may be used when a single pattern is being molded. In an alternative embodiment, the outer encapsulant 350 may be applied using a transfer molding process. In other embodiments, the outer encapsulant 350 may be applied using injection molding, granulate molding, powder molding, or liquid molding. Alternatively, the outer encapsulant 350 may be applied using printing processes such as stencil or screen printing. A curing process may be performed to form a lead package.

Figure 16:
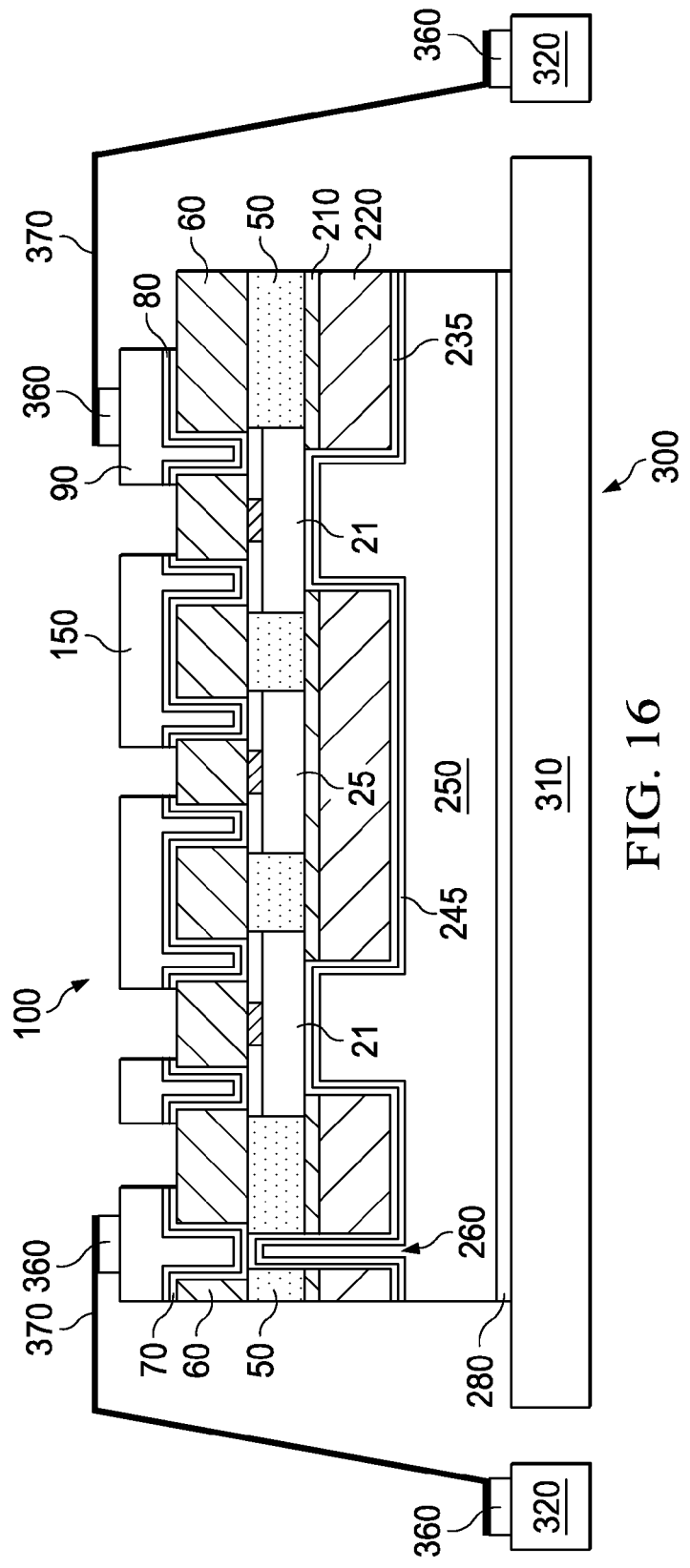
FIGS. 16-17 illustrate a cross-sectional view of a semiconductor package during various stages of fabrication in accordance with an alternative embodiment of the present invention.
Figure 17:
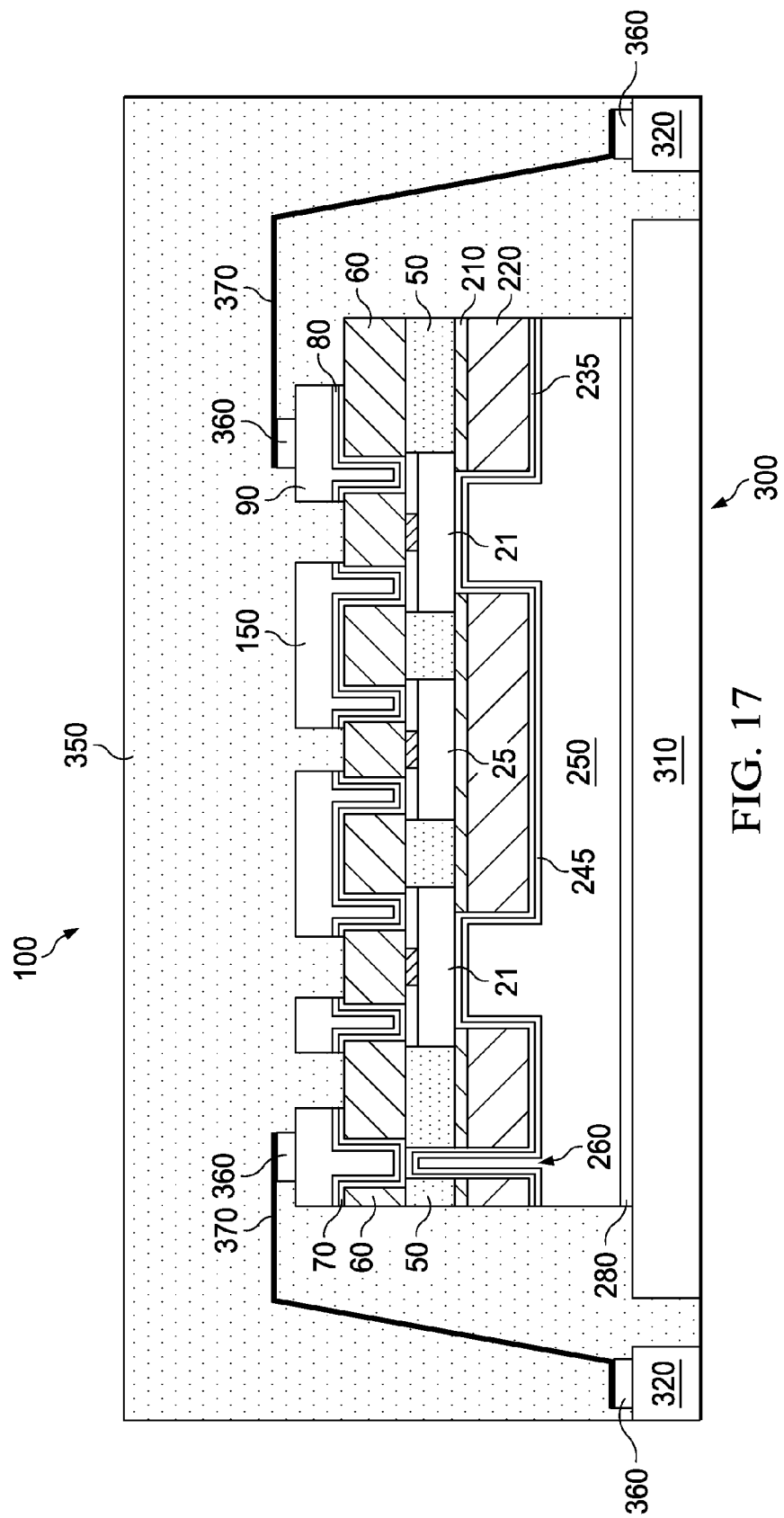

FIGS. 16-17 illustrate alternative embodiments of forming the semiconductor package.

Unlike the embodiment illustrated in FIGS. 14-15, in this embodiment, the interconnects between the semiconductor module 100 and the leadframe 300 comprise clips 370. The clips 370 may be attached to the leads 320 of the leadframe 300 using clip adhesive layer 360, e.g., a solder material or a conductive paste. As described previously, an outer encapsulant 350 is formed over the leadframe 300 and the semiconductor module 100 after attaching the clips 370.

In a further alternative embodiment, the interconnects between the semiconductor module 100 and the leadframe 300 may be formed using a galvanic process (electro chemical deposition).

Embodiments of the invention also include forming a first finished product such as the semiconductor module 100 described in various embodiments. The first finished product may be package that may not be compliant with standard packaging modules such as JEDEC standards. This first finished product, while may be sold to some customers directly, may be further packaged within a leadframe to form a second finished package such as the leadframe package described above in various embodiments. The second finished package may be compliant with standard packaging such as JEDEC standards. However, both the first and the second finished packages have similar function and operation. For example, the lead frame package may not have additional semiconductor devices besides those in the semiconductor module 100.

Figure 18:
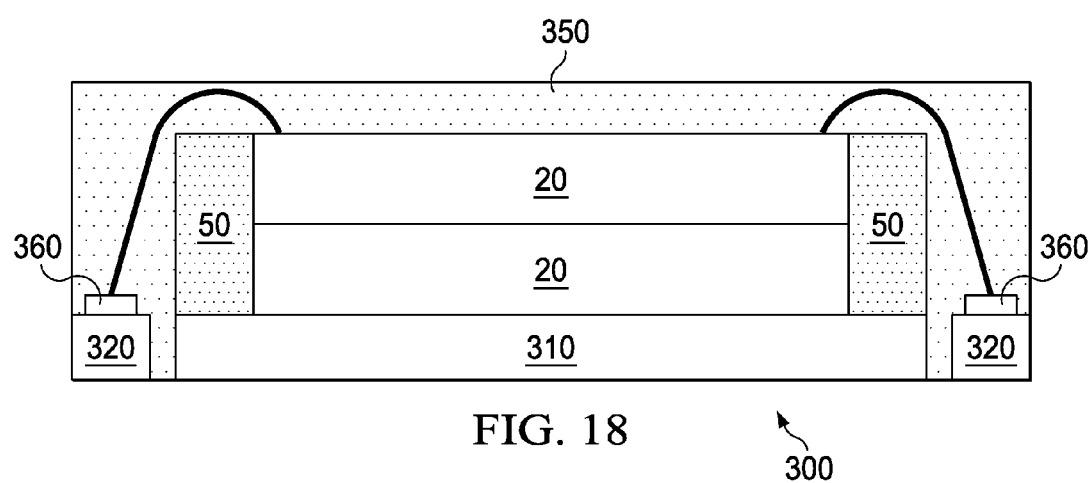
FIG. 18 illustrates another embodiment of the semiconductor package illustrating a stacked semiconductor package in package.

FIG. 18 illustrates another embodiment of the semiconductor package illustrating a stacked semiconductor package in package.

In this embodiment, the semiconductor module 100 may include a stacking of a plurality of semiconductor chips 20, which may be coupled using through vias. The semiconductor module 100 is disposed over the leadframe 300 and packaged to form a standard leadframe package.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-17 may be combined with each other. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a package-in-package, the method comprising:
   providing a leadframe having a plurality of leads and a die paddle;
   forming an embedded wafer level package, wherein the embedded wafer level package comprises a plurality of semiconductor chips embedded in a first encapsulant so that the first encapsulant surrounds edge surfaces of the semiconductor chips;
   forming a semiconductor module by dicing the embedded wafer level package by removing portions of the first encapsulant between edge surfaces of adjacent semiconductor chips, the semiconductor module comprising a first semiconductor chip disposed in the first encapsulant, the semiconductor module having a plurality of contact pads coupled to the first semiconductor chip;
   attaching the semiconductor module over the die paddle of the leadframe; and
   forming a second encapsulant at the semiconductor module and the leadframe.

2. The method of claim 1, wherein the semiconductor module comprises a second semiconductor chip, and wherein the first semiconductor chip is coupled to the second semiconductor chip through front side redistribution lines disposed proximate a first side of the semiconductor module.

3. The method of claim 2, wherein the first semiconductor chip is further coupled to the second semiconductor chip through back side redistribution lines disposed proximate a second side of the semiconductor module.

4. The method of claim 3, wherein the first encapsulant is disposed between the front side redistribution lines and the back side redistribution lines.

5. The method of claim 2, wherein the second semiconductor chip is embedded in the first encapsulant and wherein the front side redistribution lines overly a portion of the first encapsulant.

6. The method of claim 1, wherein the first semiconductor chip is a discrete power transistor.

7. The method of claim 1, wherein the plurality of contact pads comprises a source contact pad, a drain contact pad, and a control contact pad.

8. The method of claim 7, wherein the source contact pad is coupled to a first side of the first semiconductor chip, and wherein the drain contact pad is coupled to an opposite second side of the first semiconductor chip.

9. The method of claim 1, wherein the arrangement of the plurality of leads is independent from the arrangement of the plurality of contact pads on the first semiconductor chip.

10. The method of claim 1, wherein the total number of the plurality of leads is different from the total number of the plurality of contact pads of the semiconductor module.

11. The method of claim 1, wherein the plurality of leads is coupled to the plurality of contact pads using wire bonding or lead bonding.

12. A method of forming a package-in-package, the method comprising:
   providing a leadframe having a plurality of leads and a die paddle;
   forming an embedded wafer level package, wherein the embedded wafer level package comprises a plurality of semiconductor chips embedded side-by-side in a first encapsulant;
   dicing the embedded wafer level package by cutting the first encapsulant to form a semiconductor module, the semiconductor module comprising a first semiconductor chip disposed in a first encapsulant, the semiconductor module having a plurality of contact pads coupled to the first semiconductor chip;
   attaching the semiconductor module over the die paddle of the leadframe; and
   forming a second encapsulant at the semiconductor module and the leadframe to form a leadframe package, wherein the semiconductor module is a non-standard package, wherein the leadframe package is a standard package compliant with a standard, the semiconductor module and the leadframe package having substantially the same functionality.

13. The method of claim 12, wherein the leads of the leadframe comprise a first plurality of leads at a first edge of the leadframe and a second plurality of leads at a second edge of the leadframe, the die paddle disposed between the first edge and the second edge.

14. The method of claim 12, wherein the first semiconductor chip is a discrete power transistor.

15. A method of forming a package-in-package, the method comprising:
   providing a leadframe having a plurality of leads and a die paddle;
   forming an embedded wafer level package;
   dicing the embedded wafer level package to form a semiconductor module, wherein the semiconductor module comprises a first semiconductor chip disposed in a first encapsulant, wherein the semiconductor module has a plurality of contact pads coupled to the first semiconductor chip, wherein the semiconductor module further comprises a second semiconductor chip disposed in the first encapsulant, and wherein the first semiconductor chip is coupled to the second semiconductor chip through front side redistribution lines overlying a portion of the first encapsulant between the first and second semiconductor chips at a first side of the semiconductor module;
   attaching the semiconductor module over the die paddle of the leadframe; and
   forming a second encapsulant at the semiconductor module and the leadframe.

16. The method of claim 15, wherein the first semiconductor chip is further coupled to the second semiconductor chip through back side redistribution lines disposed proximate a second side of the semiconductor module.

17. The method of claim 15, wherein the first semiconductor chip is a discrete power transistor.

* * * * *